United States Patent [19]

Mostafazadeh

[11] Patent Number: 5,408,127
[45] Date of Patent: Apr. 18, 1995

[54] METHOD OF AND ARRANGEMENT FOR PREVENTING BONDING WIRE SHORTS WITH CERTAIN INTEGRATED CIRCUIT COMPONENTS

[75] Inventor: Shahram Mostafazadeh, San Jose, Calif.

[73] Assignee: National Semiconductor Corporation, Santa Clara, Calif.

[21] Appl. No.: 215,493

[22] Filed: Mar. 21, 1994

[51] Int. Cl.⁶ .................. H01L 23/48; H01L 29/44; H01L 29/52; H01L 29/60
[52] U.S. Cl. .................................... 257/676; 257/666
[58] Field of Search ............................ 257/676, 666

[56] References Cited

FOREIGN PATENT DOCUMENTS

| | | | |
|---|---|---|---|
| 56-24958 | 3/1981 | Japan | 257/676 |
| 59-159549 | 9/1984 | Japan | 257/676 |
| 60-84854 | 5/1985 | Japan | 257/676 |
| 2-54567 | 2/1990 | Japan | 257/676 |
| 3-129869 | 6/1991 | Japan | 257/676 |

Primary Examiner—William D. Larkins
Assistant Examiner—S. V. Clark
Attorney, Agent, or Firm—Hickman & Beyer

[57] ABSTRACT

An integrated circuit package is disclosed herein including one or more dies, each of which has an array of input/output bond pads, a leadframe which includes an array of electrically conductive leads, and an array of bonding wires, each of which extends along its length between and is connected at its opposite ends to a respective die bond pad and a corresponding lead on the leadframe or a corresponding die bond pad on another die. There is also disclosed a technique for using a bridge arrangement to prevent the bonding wires from contacting the die or dies along the length of each of the wires. In fabricating the package just described, the bridge arrangement is provided as part of either the leadframe or part of a heater block which is a component of the equipment that may be used in manufacturing the integrated circuit package.

3 Claims, 4 Drawing Sheets

METHOD OF AND ARRANGEMENT FOR PREVENTING BONDING WIRE SHORTS WITH CERTAIN INTEGRATED CIRCUIT COMPONENTS

BACKGROUND OF THE INVENTION

The present invention relates generally to an integrated circuit package and other such electronic devices fabricated using the technique of wire bonding together certain components making up the device, and more specifically to a method of and arrangement for preventing the bonding wires from contacting, at points other than their endpoints, certain other components of the integrated circuit package or other such devices.

A typical integrated circuit package includes a die having an array of die input/output bond pads and a leadframe having an array of electrically conductive leads respectively connected to corresponding die bond pads by means of cooperating bonding wires. An example of such a package is illustrated in FIG. 1 and generally designated by the reference numeral 10. Integrated circuit package 10 is shown including a leadframe 12 having an array of electrically conductive leads, one of which is indicated at 14. Leadframe 12 supports a die 16 having an array of die input/output bond pads, one of which is indicated at 18. The electrically conductive lead 14 is shown connected with die bond pad 18 by means of an electrically conductive bonding wire 20.

In the particular example illustrated in FIG. 1, it is conventional practice to use a thermosonic or thermocompression ball bonding tool to first ball bond the free end of wire 20 to pad 18, as indicated by ball bond 22, and thereafter stitch bond the opposite end of bonding wire 20 to lead 14, as indicated by stitch bond 24. In certain instances, there are good reasons to reverse this process, as is illustrated in FIG. 2. Referring to FIG. 2, in reverse bonding, a ball bonding tool is used to first ball bond the free end of wire 20 to lead 14 on leadframe 12, as indicated by ball bond 22, and thereafter stitch bond the opposite end of wire 20 to die bond pad 18 on die 16, as indicated by stitch bond 24. However, applicants have discovered a potential problem when reverse bonding. After stitch bonding wire 20 to die bond pad 18 as indicated by stitch bond 24, bonding wire 20 may come into contact with the edge of die 16 as indicated by contact point 26 causing a die edge short.

FIG. 6 illustrates parts of the integrated circuit package including leadframe 12, die 16 and an array of bonding wires as described above supported by a heater block 36. It is conventional practice to use this type of heater block, which is a component of the equipment that may be used in manufacturing the package, to support the components during the wire bonding process. However when reverse bonding, as described above, this configuration has the potential problem of the above mentioned die edge short. The present invention eliminates this problem in a reliable and uncomplicated way.

SUMMARY OF THE INVENTION

As will be described in more detail hereinafter, an electronic device is disclosed including one or more dies, each of which has an array of input/output bond pads, a leadframe which includes an array of electrically conductive leads, and an array of bonding wires, each of which extends along its length between and is connected at its opposite ends to a respective die bond pad and a corresponding lead on the leadframe or a corresponding die bond pad on another die. In accordance with the present invention a spacer arrangement is provided mechanically preventing the bonding wires from contacting the die or dies along the length of each of the wires.

In one embodiment of the present invention the spacer arrangement is provided as part of the leadframe. In another embodiment of the present invention the spacer arrangement is provided as part of a heater block which is a component of the equipment that may be used in manufacturing the integrated circuit package.

BRIEF DESCRIPTION OF THE DRAWINGS

The features of the present invention may best be understood by reference to the following description of the presently preferred embodiments together with the accompanying drawings in which.

DETAILED DESCRIPTION OF THE PREFERRED EMBODIMENTS

Figure 1:
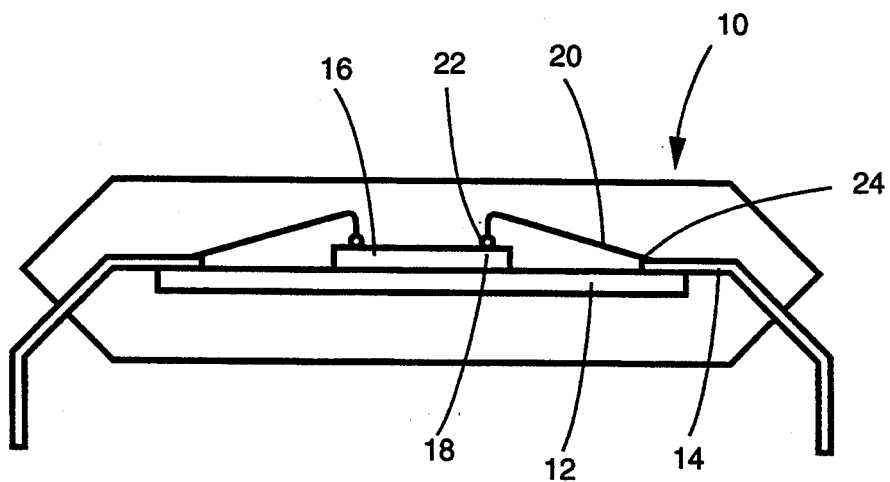
FIG. 1 is a diagrammatic cross-sectional view of an integrated circuit package including a die supported on a leadframe and specifically depicts a prior art thermosonic or thermocompression wire bonding technique for electrically connecting a die bond pad forming part of the die with an electrically conductive lead forming part of the leadframe.
Figure 2:
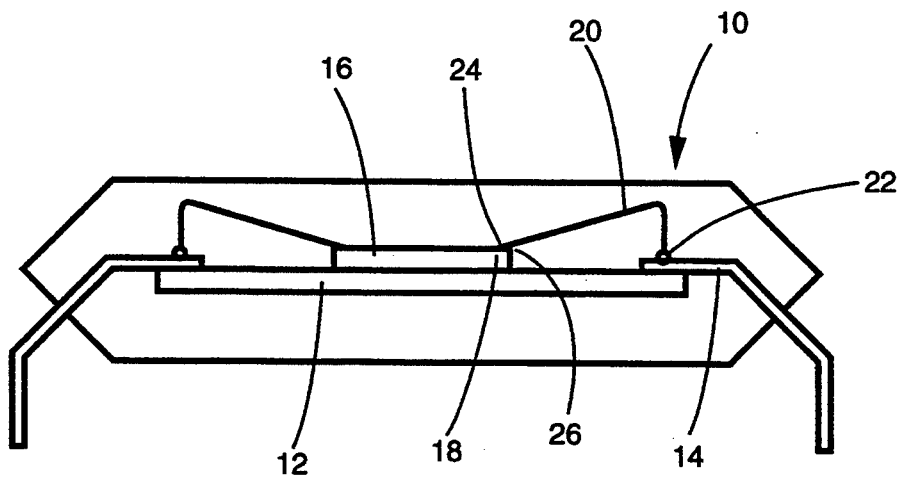
FIG. 2 is a diagrammatic cross-sectional view of an integrated circuit package similar to FIG. 1 illustrating the reverse bonding technique.
Figure 3:
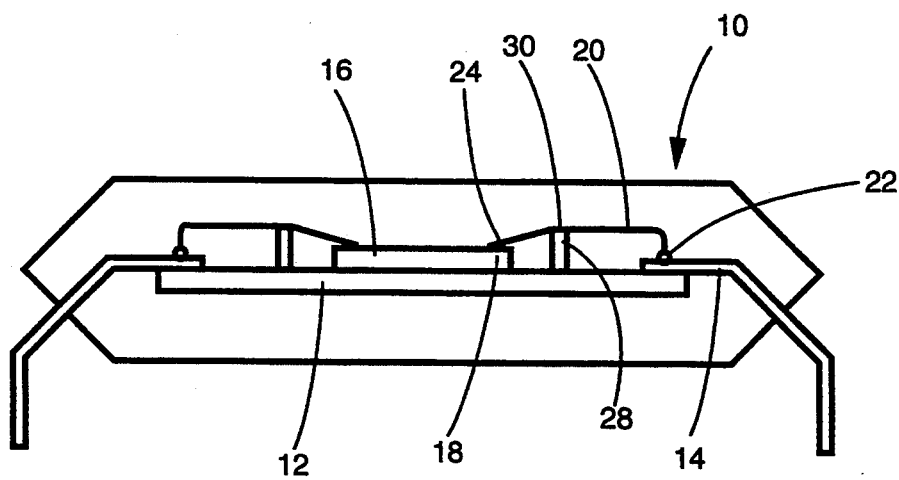
FIG. 3 is a diagrammatic cross-sectional view of an integrated circuit package fabricated in accordance with the present invention in which a spacer arrangement for preventing the bonding wires from contacting certain other components of the package is provided as part of the leadframe.

Inasmuch as FIGS. 1 and 2 were discussed previously, attention is directed to FIG. 3 which illustrates one of the preferred embodiments of the present invention. Like FIG. 2, FIG. 3 illustrates an integrated circuit package 10 including leadframe 12 which supports an array of electrically conductive leads including lead 14. Leadframe 12 supports die 16 having an array of die input/output bond pads, one of which is indicated at 18. The electrically conductive lead 14 is shown connected with die bond pad 18 by means of an electrically conductive bonding wire 20. However, in the preferred embodiment illustrated in FIG. 3, an upstanding electrically non conductive spacer or bridge arrangement 28 is provided as part of leadframe 12 in such a way that bridge arrangement 28 engages the bonding wires, one of which is illustrated by bonding wire 20 at point 30, mechanically preventing bonding wire 20 from contacting die 16 at points other than die bond pad 18. As shown in FIG. 3, bridge arrangement 28 extends up from leadframe 12 to a height somewhat above the upper surface of die 16 which causes bonding wire 20 to approach die 16 at a relatively steep angle thereby preventing bonding wire 20 from contacting die 16 at points other than die bond pad 18. This arrangement is typical for each of the bonding wires making up the array of bonding wires that electrically connect each of the die bond pads on die 16 to a respective one of the leads on leadframe 12.

Figure 4:
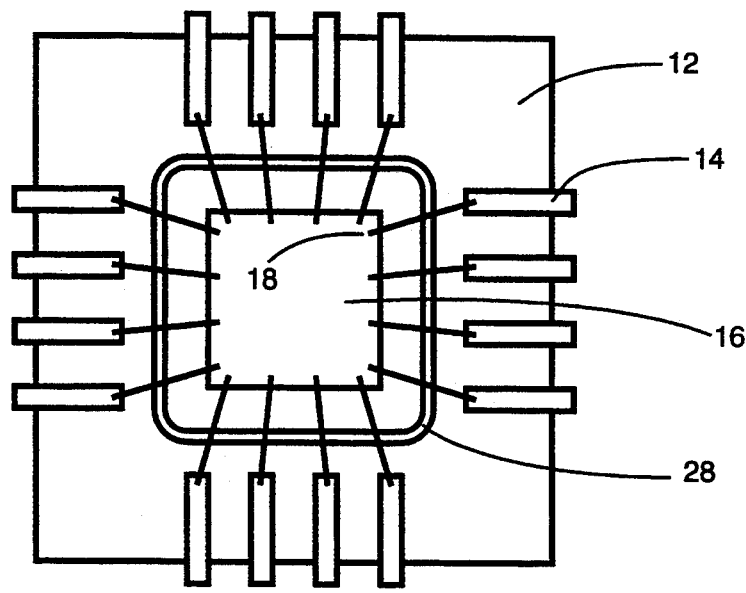
FIG. 4 is a diagrammatic plan view of an integrated circuit package fabricated in accordance with the present invention in which the spacer arrangement for preventing the bonding wires from contacting certain other components of the package is provided as part of the leadframe.

FIG. 4 illustrates a plan view of the integrated circuit package described above and shown in FIG. 3 which includes die 16 surrounded by the array of leads, one of which is indicated at 14, on leadframe 12. Bridge arrangement 28 also surrounds die 16 and is positioned between the array of leads and die 16. As described above, bridge arrangement 28 engages the array of bonding wires preventing the bonding wires from contacting die 16 at points other than their endpoints. In the embodiment illustrated in FIG. 4, bridge arrangement 28 consists of a continuous blade formed as an integral pan of leadframe 12. However in other embodiments the bridge arrangement may take the form of a plurality of blades formed as part of the leadframe, one or more independently formed blades which are attached to the leadframe as part of the fabrication process, or a variety of other such forms.

Figure 5:
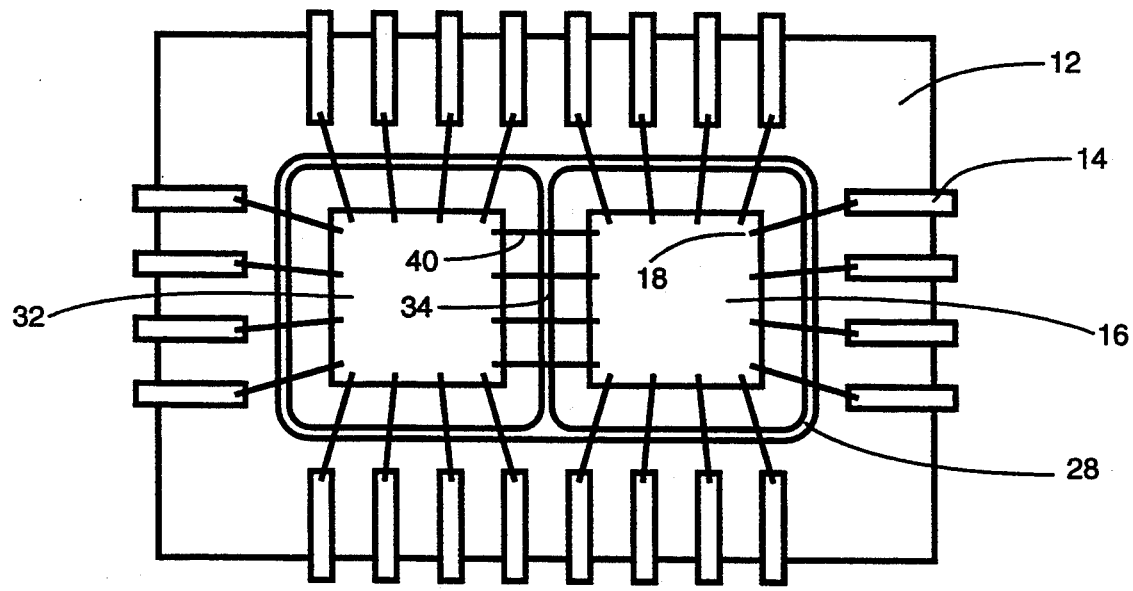
FIG. 5 is a diagrammatic plan view of an integrated circuit package fabricated in accordance with the present invention in which the spacer arrangement for preventing the bonding wires from contacting certain other components of the package is provided as part of the leadframe, and the leadframe supports two dies.
Figure 6:
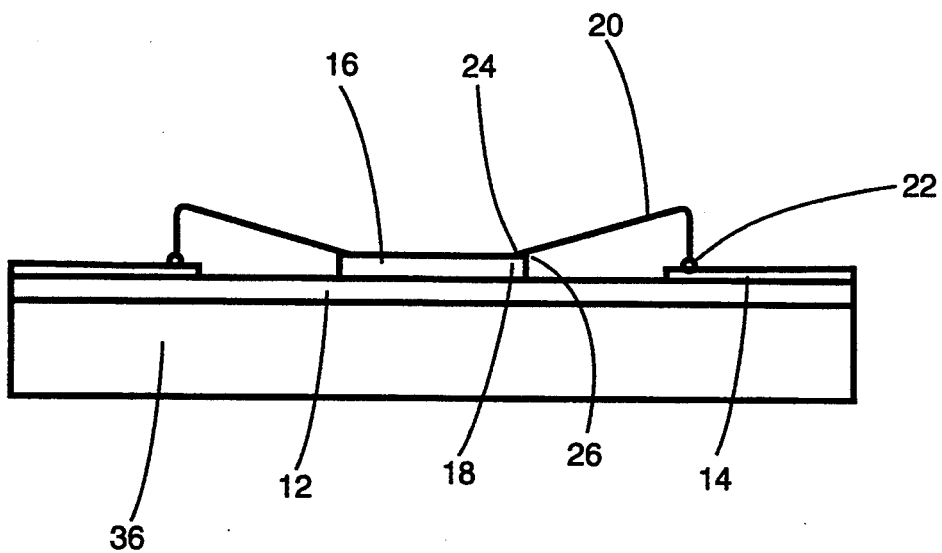
FIG. 6 is a diagrammatic cross-sectional view of a typical prior art heater block which is a component of the equipment used in the manufacture of an integrated circuit package.

Another preferred embodiment is illustrated in FIG. 5, wherein the integrated circuit package includes the components described above and shown in FIG. 4, along with an additional die 32. Like the integrated circuit package shown in FIG. 4, the integrated circuit package shown in FIG. 5 includes die 16 and additional die 32 surrounded by the array of leads, one of which is indicated at 14, on leadframe 12. Bridge arrangement 28 also surrounds dies 16 and 32 and is positioned between the array of leads and dies 16 and 32. Bridge arrangement 28 includes an additional blade 34 positioned between die 16 and die 32. Also, an additional array of bonding wires connect die 16 to die 32, one of which is indicated by bond wire 40. As described above, bridge arrangement 28 engages all of the bonding wires preventing the bonding wires from contacting die 16 and 32 at points other than their endpoints. Although the above description discloses only one additional die, it should be understood that other embodiments may include a plurality of dies, each surrounded by a bridge arrangement for preventing bonding wire contact.

Figure 7:
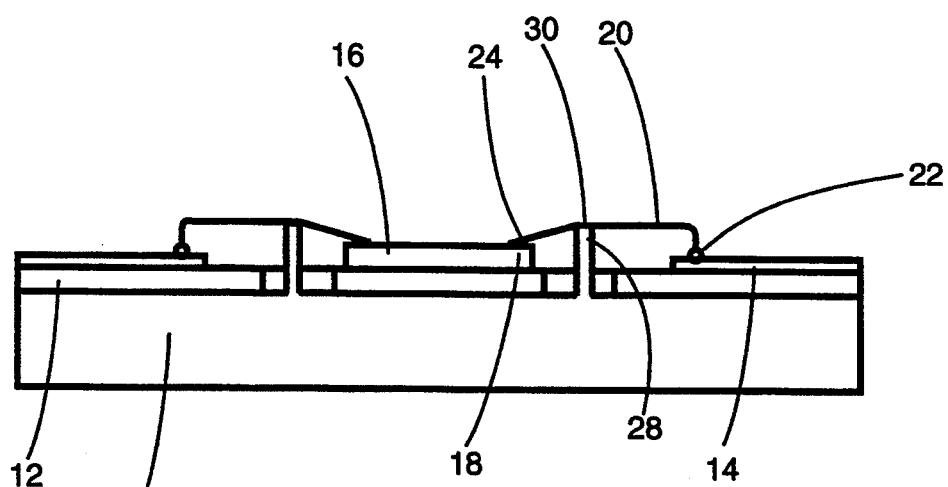
FIG. 7 is a diagrammatic cross-sectional view of a heater block designed in accordance with the present invention which includes the spacer arrangement for preventing the bonding wires from contacting certain other components of the integrated circuit package, also shown are the integrated circuit package components which are supported by the heater block during the fabrication of the integrated circuit package.

An alterative embodiment of the invention is illustrated in FIG. 7, which shows a cross-sectional view of a heater block 36 which is a component of the equipment that may be used in the process of wire bonding together the components of an integrated circuit package. Heater block 36 supports leadframe 12 which in turn supports die 16 and an array of leads, one of which is indicated by lead 14. Die 16 includes an array of die input/output bond pads, one of which is indicated by bond pad 18. In the same way as described above and illustrated in FIG. 3, an array of bonding wires electrically connects die 16 to the array of leads. However, in the embodiment shown in FIG. 7, bridge arrangement 28 for engaging the bonding wires is provided on heater block 36 instead of leadframe 12. As mentioned above, bridge arrangement 28 may take the form of a continuous blade formed as an integral part of heater block 36. However in other embodiments the bridge arrangement may take the form of a plurality of blades formed as pan of the heater block, one or more independently formed blades which are attached to the heater block as pan of the fabrication process, or a variety of other such forms.

Figure 8:
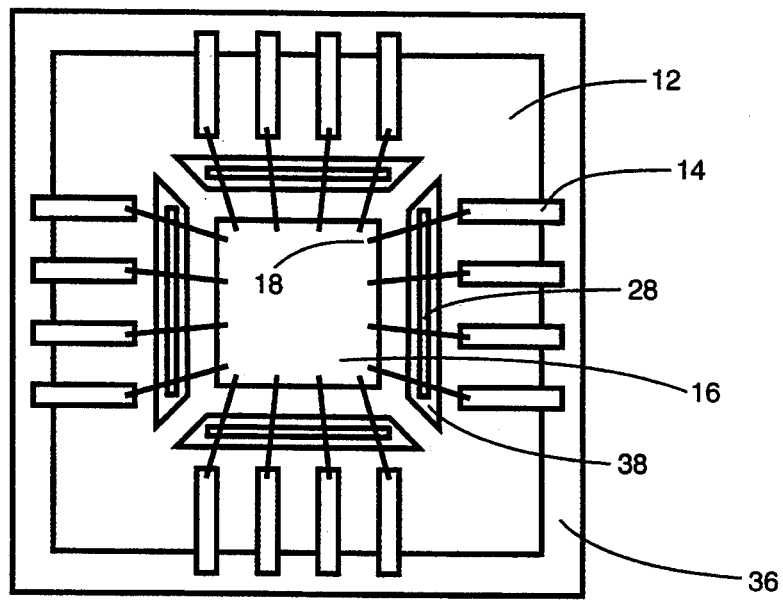
FIG. 8 is a diagrammatic plan view of a heater block designed in accordance with the present invention which includes the spacer arrangement for preventing the bonding wires from contacting certain other components of the integrated circuit package, also shown are the integrated circuit package components which are supported by the heater block during the fabrication of the integrated circuit package.

FIG. 8 is a plan view of the arrangement described above and shown in FIG. 7. Every thing is the same as was described for the integrated circuit package shown in FIG. 4 except that leadframe 12 has openings 38 positioned between die 16 and the leads surrounding die 16. Openings 38 provide a space for bridge arrangement 28 which is supported by heater block 36 to protrude through the openings in leadframe 12 and engage the bonding wires preventing bonding wire contact with die 16 at points other than their endpoints.

Figure 9:
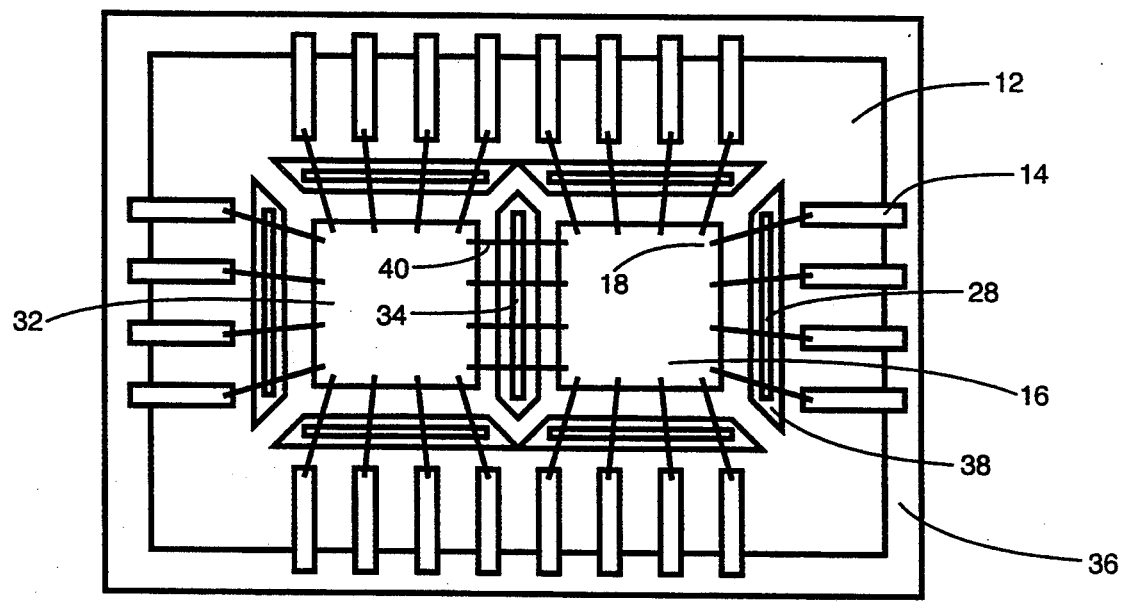
FIG. 9 is a diagrammatic plan view of a heater block in accordance with the present invention which includes the spacer arrangement for preventing the bonding wires from contacting certain other components of the integrated circuit package, also shown are the integrated circuit package components which are supported by the heater block during the fabrication of the integrated circuit package wherein these components include two dies.

FIG. 9 illustrates an arrangement similar to FIG. 8, except that leadframe 12 supports an additional die in a similar way as was described for FIG. 5. As was mentioned above, although this description discloses only one additional die, it should be understood that other embodiments may include a plurality of dies, each surrounded by a bridge arrangement for preventing bonding wire contact.

The method and arrangement for preventing bonding wire shorts described above in association with FIGS. 2-9 has been described in conjunction with an integrated circuit package including one or more die and a leadframe. It is to be understood that this method and arrangement is not limited to such applications but may be provided in any case where it is necessary to provide a stitch bond to the die bond pad of a die. Indeed, even in cases other than a die, it may be necessary to provide a stitch bond to a surface that, like the die, could allow a short. The present method and arrangement are equally applicable in that situation. Moreover, the method and arrangement applies when connecting pads to pads, pads to leads, and electrically conductive contacts to contacts generally.

What is claimed is:

1. A leadframe for use in an integrated circuit package including (i) a die having an array of die input/output bond pads, (ii) means for supporting said leadframe and said die, and (iii) a first array of bonding wires, each of which is connected at its opposite ends to a respective one of said pads of said die and a corresponding lead forming part of said leadframe, said leadframe comprising;
(a) a die attach pad adapted to support said die;
(b) an array of leads surrounding and spaced apart from said die attach pad;
(c) a substrate supporting said leads; and
(d) bridge means adapted to engage each of said bonding wires making up said first array of bonding wires so as to mechanically prevent each of said bonding wires making up said first array of bonding wires from contacting said die at points other than said respective one of said pads of said die, said bridge means including a plurality of blades extending from said leadframe between said die attach pad and said leads on said leadframe, said integrated circuit package including (i) an additional die supported by said die attach pad having an array of die input/output bond pads, (ii) a second array of bonding wires, each of which is connected at its opposite ends to a respective one of said pads of said additional die and a corresponding one of said leads on said leadframe, and (iii) a third array of bonding wires, each of which is connected at its opposite ends to a respective one of said pads of said additional die and a corresponding one of said pads on said die, and said bridge means including additional blades extending from said leadframe between said die attach pad and said leads on said leadframe and between said die and said additional die adapted to engage each of said bonding wires making up said second and third arrays of bonding wires so as to mechanically prevent each of said bonding wires making up said second and third arrays of bonding wires from contacting said die and said additional die at points other than said respective ones of said pads of said die and said additional die.

2. A heater block for use in fabricating an integrated circuit package including (i) a leadframe supported by said heater block having an array of electrically conductive leads, (ii) a die supported by said leadframe having an array of die input/output bond pads, and (iii) a first array of bonding wires, each of which is connected at its opposite ends to a respective one of said pads of said die and a corresponding lead on said leadframe, said heater block comprising,
means for supporting said leadframe and bridge means adapted to engage each of said bonding wires making up said first array of bonding wires so as to mechanically prevent each of said bonding wires from contacting said die at points other than said respective one of said pads of said die,
said leadframe including a die attach pad supporting said die and a substrate for supporting said die attach pad and said electrically conductive leads, said substrate having openings surrounding said die attach pad,
said leads on said leadframe surrounding and being spaced apart from said die attach pad by said openings,
said bridge means including a plurality of blades adapted to extend from said heater block through said openings between said die attach pad and said leads on said leadframe;

said integrated circuit package including (i) an additional die supported by said die attach pad having an array of die input/output bond pads, (ii) a second array of bonding wires, each of which is connected at its opposite ends to a respective one of said pads of said additional die and a corresponding one of said leads on said lead frame, and (iii) a third array of bonding wires, each of which is connected at its opposite ends to a respective one of said pads of said additional die and a corresponding one of said pads on said die, said substrate and said die attach pad having an additional opening between said die and said additional die, and said bridge means including additional blades adapted to extend from said heater block through said openings and additional opening and engage each of said bonding wires making up said second and third arrays of bonding wires so as to mechanically prevent each of said bonding wires making up said second and third arrays of bonding wires from contacting said die and said additional die at points other than said respective ones of said pads of said die and said additional die.

3. An integrated circuit package including (i) a leadframe, (ii) a die having an array of die input/output bond pads, (iii) means for supporting said leadframe and said die, and (iv) a first array of bonding wires, each of which is connected at its opposite ends to a respective one of said pads of said die and a corresponding lead forming part of said leadframe, said leadframe comprising;
(a) a die attach pad adapted to support said die;
(b) an array of leads surrounding and spaced apart from said die attach pad;
(c) a substrate supporting said leads; and
(d) bridge means adapted to engage each of said bonding wires making up said first array of bonding wires so as to mechanically prevent each of said bonding wires making up said first array of bonding wires film contacting said die at points other than said respective one of said pads of said die, said bridge means including a plurality of blades extending from said leadframe between said die attach pad and said leads on said leadframe, said integrated circuit package including (i) an additional die supported by said die attach pad having an array of die input/output bond pads, (ii) a second array of bonding wires, each of which is connected at its opposite ends to a respective one of said pads of said additional die and a corresponding one of said leads on said leadframe, and (iii) a third array of bonding wires, each of which is connected at its opposite ends to a respective one of said pads of said additional die and a corresponding one of said pads on said die, and said bridge means including additional blades extending from said leadframe between said die attach pad and said leads on said lead frame and between said die and said additional die adapted to engage each of said bonding wires making up said second and third arrays of bonding wires so as to mechanically prevent each of said bonding wires making up said second and third arrays of bonding wires from contacting said die and said additional die at points other than said respective ones of said pads of said die and said additional die.

* * * * *